(12) United States Patent
Weinraub

(10) Patent No.: US 7,256,597 B2
(45) Date of Patent: Aug. 14, 2007

(54) DEVICE DESIGN-FOR-TEST AND BURN-IN-BOARD WITH MINIMAL EXTERNAL COMPONENTS AND INCREASED TESTING CAPACITY

(75) Inventor: Chananiel Weinraub, Herzliya (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/221,472

(22) Filed: Sep. 8, 2005

(65) Prior Publication Data

US 2007/0052436 A1    Mar. 8, 2007

(51) Int. Cl.
*G01R 31/02* (2006.01)
*G01R 31/26* (2006.01)
*G01R 31/28* (2006.01)

(52) U.S. Cl. ............ 324/760; 324/765; 324/158.1

(58) Field of Classification Search ............ 324/760
See application file for complete search history.

(56) References Cited

U.S. PATENT DOCUMENTS

| | | |
|---|---|---|
| 3,939,381 A | 2/1976 | Meany |
| 5,267,395 A | 12/1993 | Jones, Jr. et al. |
| 5,397,997 A | 3/1995 | Tuckerman et al. |
| 5,541,524 A | 7/1996 | Tuckerman et al. |
| 5,726,482 A | 3/1998 | Nathan et al. |
| 5,825,171 A | 10/1998 | Shin |
| 6,055,657 A | 4/2000 | Heo et al. |
| 6,215,324 B1 * | 4/2001 | Yoshida ............ 324/760 |
| 6,292,008 B1 | 9/2001 | Sillup et al. |
| 6,788,083 B1 * | 9/2004 | Siddiqui et al. ............ 324/760 |
| 6,850,083 B2 | 2/2005 | Leshnovolsky et al. |
| 6,861,860 B2 | 3/2005 | Maggi et al. |
| 2002/0050813 A1 * | 5/2002 | Yamamoto ............ 324/158.1 |

FOREIGN PATENT DOCUMENTS

| | | | |
|---|---|---|---|
| JP | 06-109815 | * | 4/1994 |
| JP | 2000-251496 | * | 9/2000 |
| JP | 2005-117323 | * | 4/2005 |

* cited by examiner

*Primary Examiner*—Ha Tran Nguyen
*Assistant Examiner*—Emily Y Chan
(74) *Attorney, Agent, or Firm*—Yingsheng Tung; Wade James Brady, III; Frederick J. Telecky, Jr.

(57) ABSTRACT

The invention includes a design for device design-for-test and a burn-in-board that reduce the number of external components per device on the board. Inputs to the I/Os of a device from input means are inverted between pairs of output pins. A single resister is coupled between an output that is true (e.g., not inverted) and an output that is inverted. Thus, instead of using one or more resistors per I/O from the DUT, a single resister can be coupled between inverted and non-inverted outputs.

6 Claims, 5 Drawing Sheets

DEVICE DESIGN-FOR-TEST AND BURN-IN-BOARD WITH MINIMAL EXTERNAL COMPONENTS AND INCREASED TESTING CAPACITY

CROSS-REFERENCE TO RELATED APPLICATIONS

None

FIELD OF THE INVENTION

The present invention relates testing of integrated circuits at stressed conditions. More specifically, the present invention includes a device for design for test ("DFT") of Integrated processors Circuits (IC) that are tested on a burn-in-board, and a methods realized for performing burn-in tests.

BACKGROUND OF THE INVENTION

After the manufacturing of integrated circuits (ICs), such as a computer processors, multiple IC devices are placed onto a burn-in-board ("BIB") and tested at stressed conditions at elevated temperatures for a specific time period in a "burn-in" test. A burn-in test will reveal infant mortality failures of an IC by thermally and electrically stressing each device with accompanying functional testing to measure output signals from the device-under-test ("DUT"). In fabrication and manufacturing of an IC device, the processes can introduce flaws in any one of several physical mechanisms of the device, which can lead to ultimate failure. Such a flaw can be directly affected by a burn-in program so as to fail prematurely. The ICs that fail a result of fabrication errors, and ICs that fail early in the test procedure indicate a much earlier expected failure than if the IC was used under actual operating conditions. Burn-in tests also expose ICs that do not have apparent manufacturing flaws but would nevertheless fail during the expected life of the device.

DUTs are loaded onto a BIB, which is a test board that are typically larger than a common computer add-on board. The BIB is placed into a Burn-In oven or a chamber that subjects the devices to increased temperature and voltage conditions. The devices are then exercised under a variety of stresses while verifying that the correct stimuli is applied by monitoring one output pin of each DUT without removing them from the BIB. The DUTs are electrically stressed by connected terminals on the devices to signal supply pins of a test system, where increased voltage and elevated current are supplied to the devices. The test system drives the test patterns into all of the DUTs mounted on the BIB. The electrical stress tests can be performed on each input/output (I/O) of the devices. Devices that fail to operate normally during the burn-in test are declared defective and are discarded based on results of subsequent testing. Further, a burn-in test can determine under what temperature ranges different devices can be expected to reliably operate.

Most conventional BIBs have electronics and wiring to connect signal drivers and signal receivers to the DUTs. The system may have a driver board outside the oven that is operably connected to the BIB through a backplane board. The driver board contains components including traces for power, ground, and control signals to and from the BIB.

The BIB is used to stress the devices after the devices are tested on a load board. ICs that pass the burn-in test go back to a load board for further tests. The ICs that pass the final tests will be sold. For the burn-in test, typically multiple devices are placed on each BIB, and the BIB is placed into an oven or chamber that is heated, for example heated up to 125° C. The devices are tested at a higher voltage than normal operating conditions. On every device, the burn-in tests exercise not only the core of the device but also the I/Os of the device by loading the device with resistors. FIG. 1 illustrates a typical conventional BIB. BIB 10 includes twenty-four burn-in sockets 12 that each receive a DUT (not shown) for testing. BIB also provides power conductors, signal conductors, and ground conductors (not shown) to couple the DUTs and the BIB to a test system through contacts 14. Each I/O terminal of a DUT is coupled to one or more resistors attached to a BIB.

The loading of the device I/Os is usually performed using one or two resistors on each output of a DUT. The two resistors can be a resistor to ground and a resistor to power. If the output goes high, the pull-down resistor will load it and the current will flow through it to ground. If the output goes low, the pull-up resistor will load it and drive the current to the output of the device. If a DUT has two hundred outputs, and each output has two resistors, then the BIB requires four hundred resisters attached to it in order to test each DUT. If a single BIB can hold fifty DUTs simultaneously, the BIB requires twenty thousand load resistors in addition to other components.

An inherent problem with convention methods for burn-in testing of ICs are the production costs. Burn-in test systems require ovens or chambers large enough to receive multiple BIBs, and each BIB costs thousands of dollars. A BIB should contain as many DUTs as possible in order to reduce production costs, but the way current devices and BIBs are designed there are too many external components required for each DUT, which increases costs. Further, because of size limitations of the system components, and the circuitry necessary to test the ICs, fewer devices can be placed onto a BIB for testing, which also increases production costs.

SUMMARY OF THE INVENTION

In view of the systems and methods described above, the present invention comprises a design for device design-for-test and a BIB design that reduce the number of external components per device on the BIB. Logic that is built into an integrated circuit (IC) in order to facilitate testing of the chip is called "Design for Test" (DFT). The present invention enables more devices to be placed on a BIB.

Using the present device for DFT and BIB, inputs to the I/Os from a scan chain or other input means are inverted between pairs of output pins. A single resister is coupled between an output that is true (e.g., not inverted) and an output that is inverted. Thus, instead of using one or more resistors per Output from the DUT, a single resister attached to the BIB can be coupled between inverted and non-inverted outputs.

The present invention reduces the need for loading resistor components attached to a burn in board up to fifty percent or more. Using fewer components will enable the BIB to receiver a greater number of devices for testing, thus increasing capacity and of the BIB and efficiency of each burn-in test. By increasing capacity of a BIB to receive integrated circuit devices for testing, fewer BIBs are needed to complete burn-in tests, thus reducing production costs.

BRIEF DESCRIPTION OF THE DRAWINGS

For a better understanding of the nature of the present invention, its features and advantages, the subsequent detailed description is presented in connection with accompanying drawings in which.

DETAILED DESCRIPTION OF THE INVENTION

Figure 1:
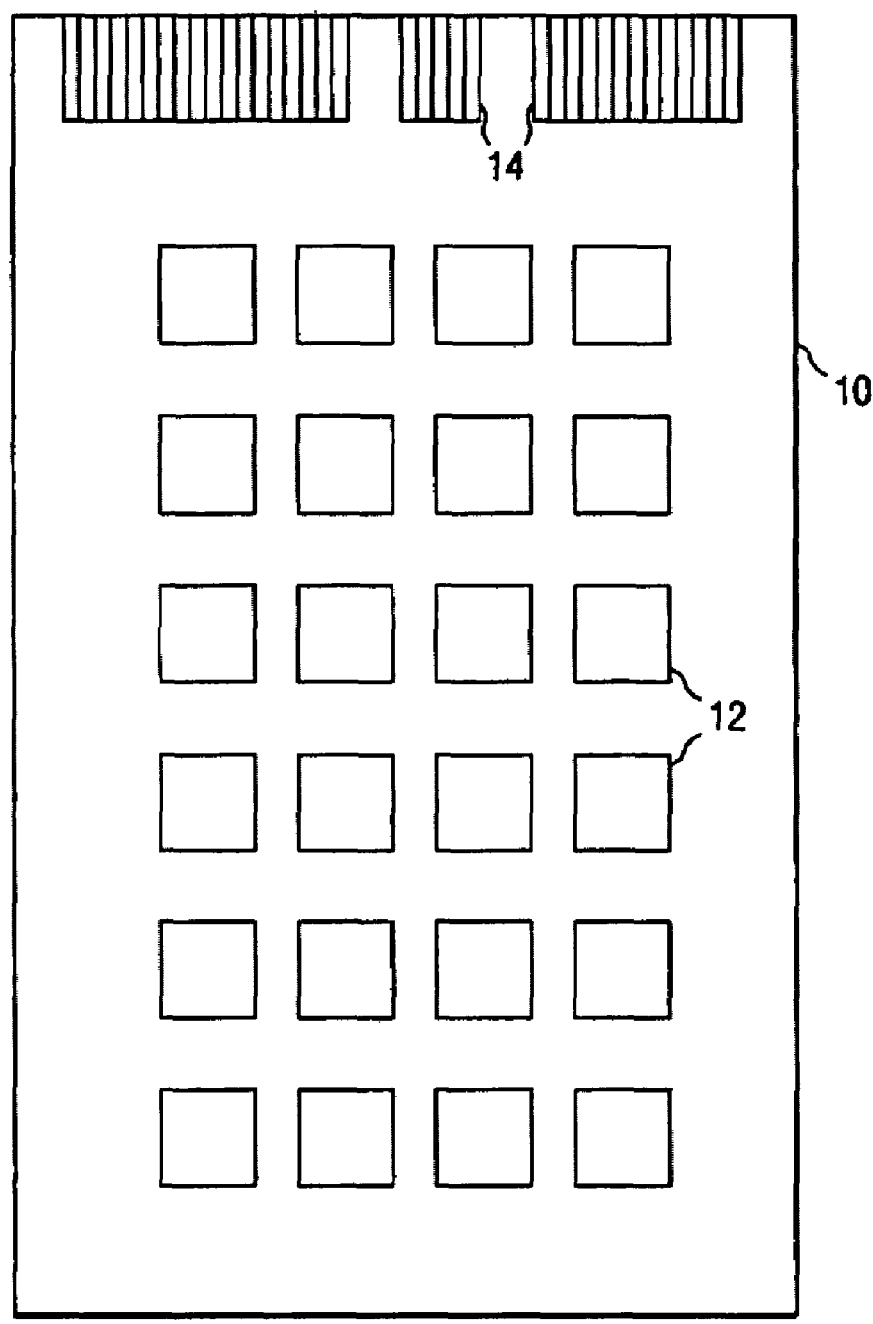
FIG. 1 is a diagram of a typical prior-art burn-in-board.
Figure 2:
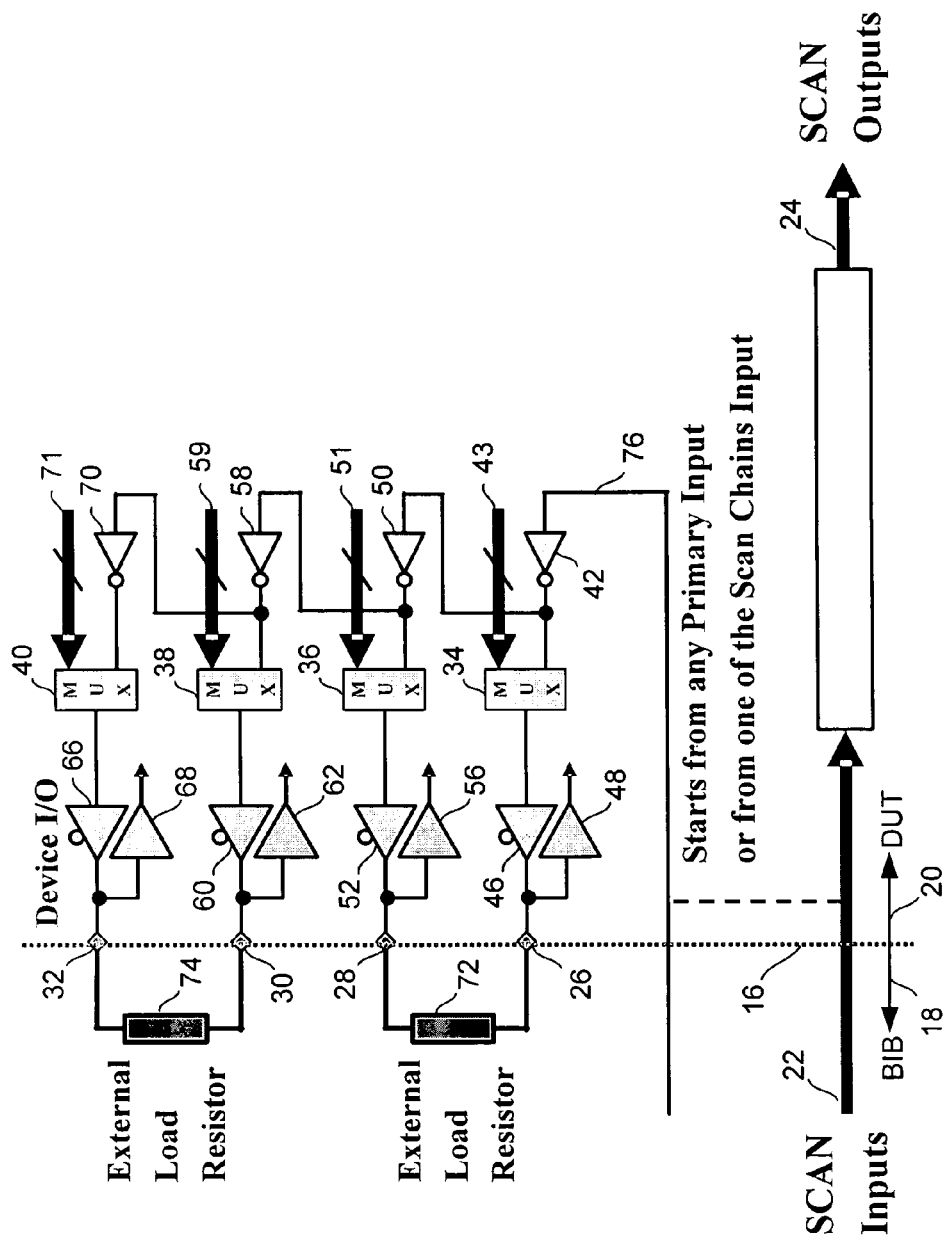
FIG. 2 is a diagram of a device DFT and a burn-in-board according to the preferred embodiment of the present invention.
Figure 5:
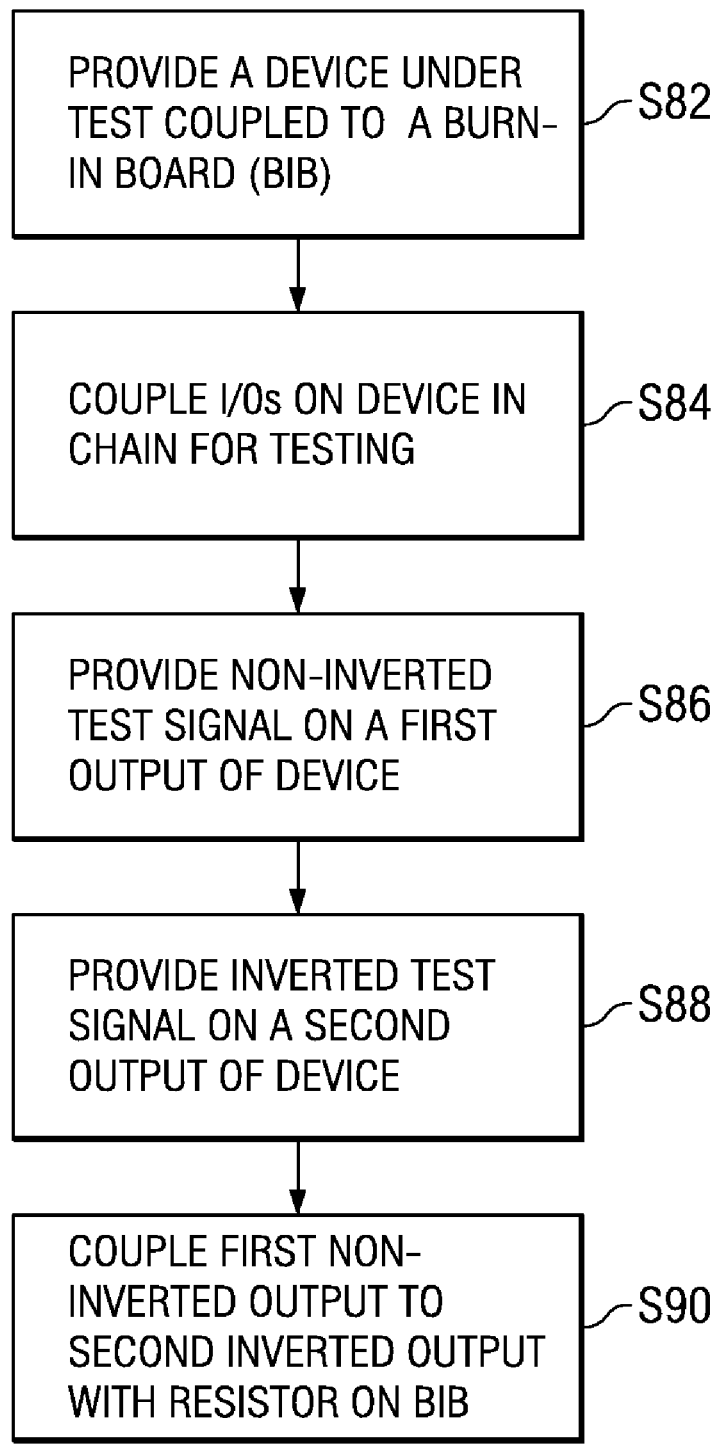
FIG. 5 is a flowchart diagram for DFT of components for a burn-in test according to the preferred embodiment.

The preferred and alternative exemplary embodiments of the present invention provide and a device design-for-test (DFT) and burn-in-board (BIB) and a method for burn-in testing that reduce the number of external components per device-under-test (DUT) on a BIB. Referring contemporaneously to the flowchart of FIG. 5 and the preferred embodiment in FIG. 2, a BIB is provided S82 with an integrated processor (IC) as the DUT on the BIB for a burn-in test. For illustrative purposes, only a portion of a BIB and a portion of a single DUT are shown in FIG. 2. However, this is not meant as a limiting factor for the purposes of the present invention. Although only four input/outputs (I/Os) are shown for the DUT, it is understood that a single BIB used in a burn-in test of devices can receive up to dozens or more of DUTs, and a single DUT can contain hundreds of inputs and outputs to which the present invention can apply. Depending upon the implementation, the circuits shown in the exemplary embodiments could be duplicated many times on I/Os on DUTs and components on BIBs.

Referring again to FIG. 2, circuit components in the diagram are divided with dividing line 16. Circuit components on the left side of dividing line 16 are formed on BIB 18, and components on the right side of the dividing line 16 are formed inside a DUT 20. An inverters chain 76 is provided S82 to connect DFT circuitry for the I/Os. Scan inputs 22 are transmitted from an external controller (not shown) through BIB 18 to the DUT 20. Scan inputs 22 exercise a device's I/O's using any primary input to the device, the internal scan chains, and/or built in self tests (BISTs) of the DUT at high temperature and high voltage conditions, which stresses the DUT for several hours. The burn-in test requires that the stress is not only internal on core logic but also external on the I/Os of the DUT. Scan outputs 24 from DUT 20 are transmitted back through BIB 18 as scan outputs 24 to a test controller for analysis.

In burn-in test mode, all bi-directional I/Os of DUT 20, except for scan inputs and test-mode control inputs, are forced to output mode. Next, data inversion is added between two outputs, and the outputs are marked as either NI (Non-Inverting) or IV (Inverting), relative to the selected input start signal 76 which is preferably one of the scan inputs 22.

In FIG. 2, first I/O 26 is connected to a DFT circuit that includes multiplexer (MUX) 34 connected to Bi-Directional I/O buffer 46 that provides both inverted test Data or Functional Output 43. MUX 34 multiplexes input signals from inverters chain 76 that are inverted through inverter 42 and Functional Output Data 43. Input Buffer 48 is connected between output 26 and Output buffer 46 and feeds back the multiplexed signals to the tested logic. The next I/O 28 is connected to MUX 36 through Output buffer 52. MUX 36 multiplexes inputs from inverter chain 76 that are inverted through inverter 50 and from Functional Output Data 51. Input Buffer 56 is connected between output 28 and Output buffer 52 to feed back the multiplexed signals to the tested logic.

Further up the inverters chain 76, a DFT circuit connected to output 30 includes MUX 38 connected to I/O 30 through Output buffer 60. MUX 38 multiplexes inputs 22 from inverters chain 76 that are inverted through inverter 58 and from Functional Output Data 59. Buffer 62 is connected between I/O 30 and Output buffer 60 to feed back multiplexed input signals to a tested Data. The fourth illustrated I/O in the DUT 20 is I/O 32 that is connected to MUX 40 through [Output buffer 66]. MUX 40 multiplexes input signals from inverters chain 76 that are inverted through inverter 70 and inputs from functional output data 71.

In burn-in test mode all bi-directional I/Os are forced to output mode (except for Scan inputs 22 and test-mode controls). Next, test data is inverted S86 to output pin 26 and is not inverted S88 to output pin 28. Location of I/O pins in the DUT is not meant as a limiting factor for purposes of the present invention. Test data may be inverted between two physically adjacent outputs, such as I/Os 26 and 28, or non-adjacent outputs, such as I/Os 26 and 32. For purposes of illustration, two adjacent outputs pins are shown in FIG. 2.

On the BIB 18, an external load resistor is coupled S90 between an output that is true and another output that is inverted. Thus, instead of placing one or more resistors on a single I/O of the DUT, a single resistor is connected to two outputs. The circuitry is constructed by coupling external load resistor 72 between adjacent I/O pins 26, outputting an inverted (IV) signal and I/O 28 outputting a non-inverted (NI) signal. A similar circuit is constructed by coupling external load resistor 74 between adjacent I/O pins 30 that outputs an IV signal and I/O 32 that outputs a-NI signal.

Either a resistor 72, 74 is coupled on the BIB between any NI and IV outputs of the same inverters chain and having the same drive strength. The couplings between NI and IV outputs can be duplicated for any I/Os of DUT 20 that are chained together. This construction enables outputs toggling under load, at the highest speed possible that the burn-in tester is capable of. Further, for high-speed testing, many inverter chains may be implemented to create shorter path delays.

Figure 3:
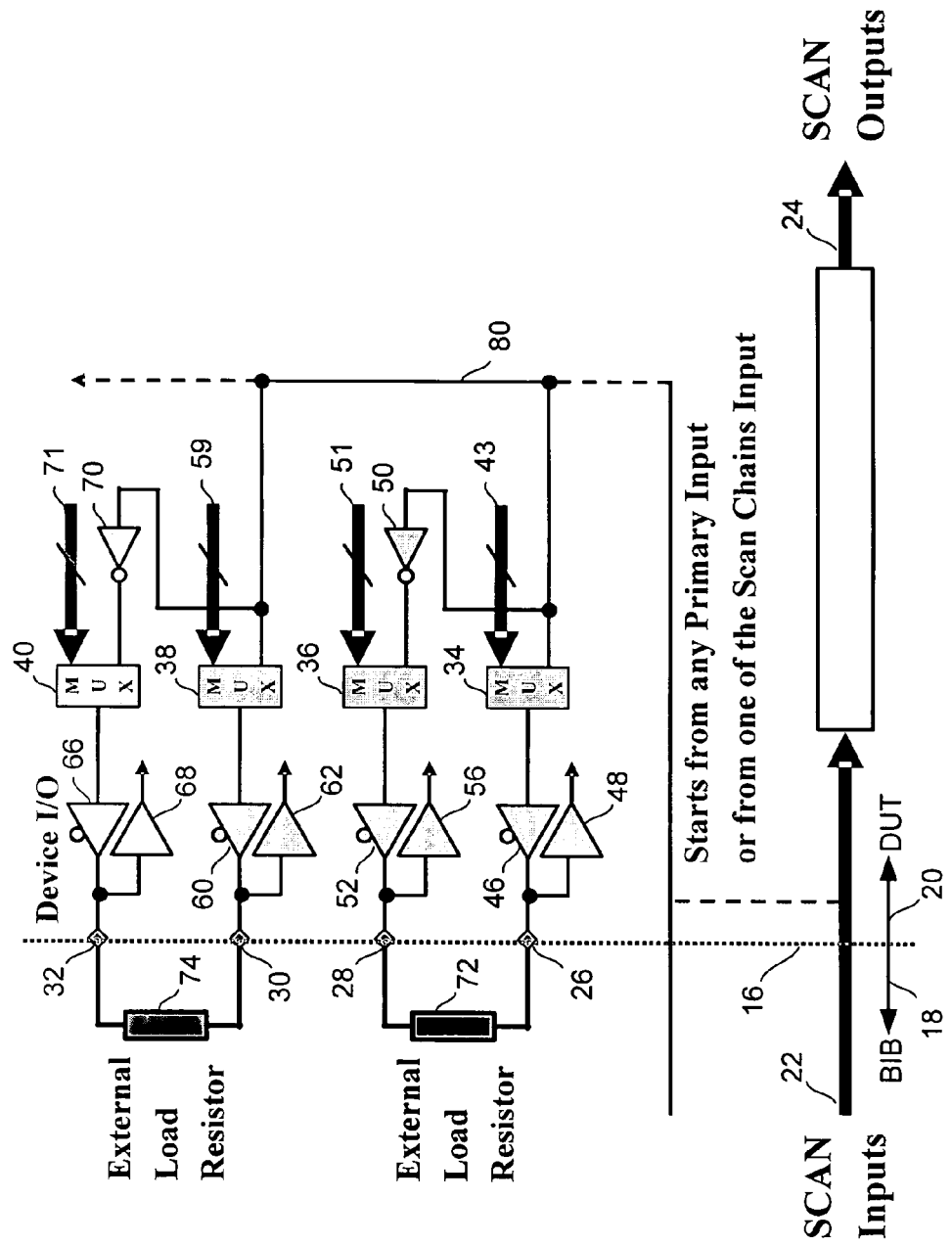
FIG. 3 is a diagram of a device DFT and burn-in-board according to a second embodiment.

FIG. 3 illustrates a diagram of the second embodiment of the present invention. The second embodiment is a modification of the system of the first embodiment that includes a different design of the inverters chain 80 couplings to the circuitry of the I/Os in the DUT 20. In FIG. 3, the inverter 42 of the preferred embodiment is removed from the circuitry for I/O 26, which is a non-inverted output, in the second embodiment. Similarly, inverter 58 of the first embodiment is removed from the circuitry of I/O 30, which is a non-inverted output, in the second embodiment. Inverters chain 80 is split to inverter 50 prior to the MUX 34 to provide and inverted output at I/O 28. The scan chain is also split to inverter 70 prior to MUX 38 to provide an inverted output at I/O 32.

Figure 4:
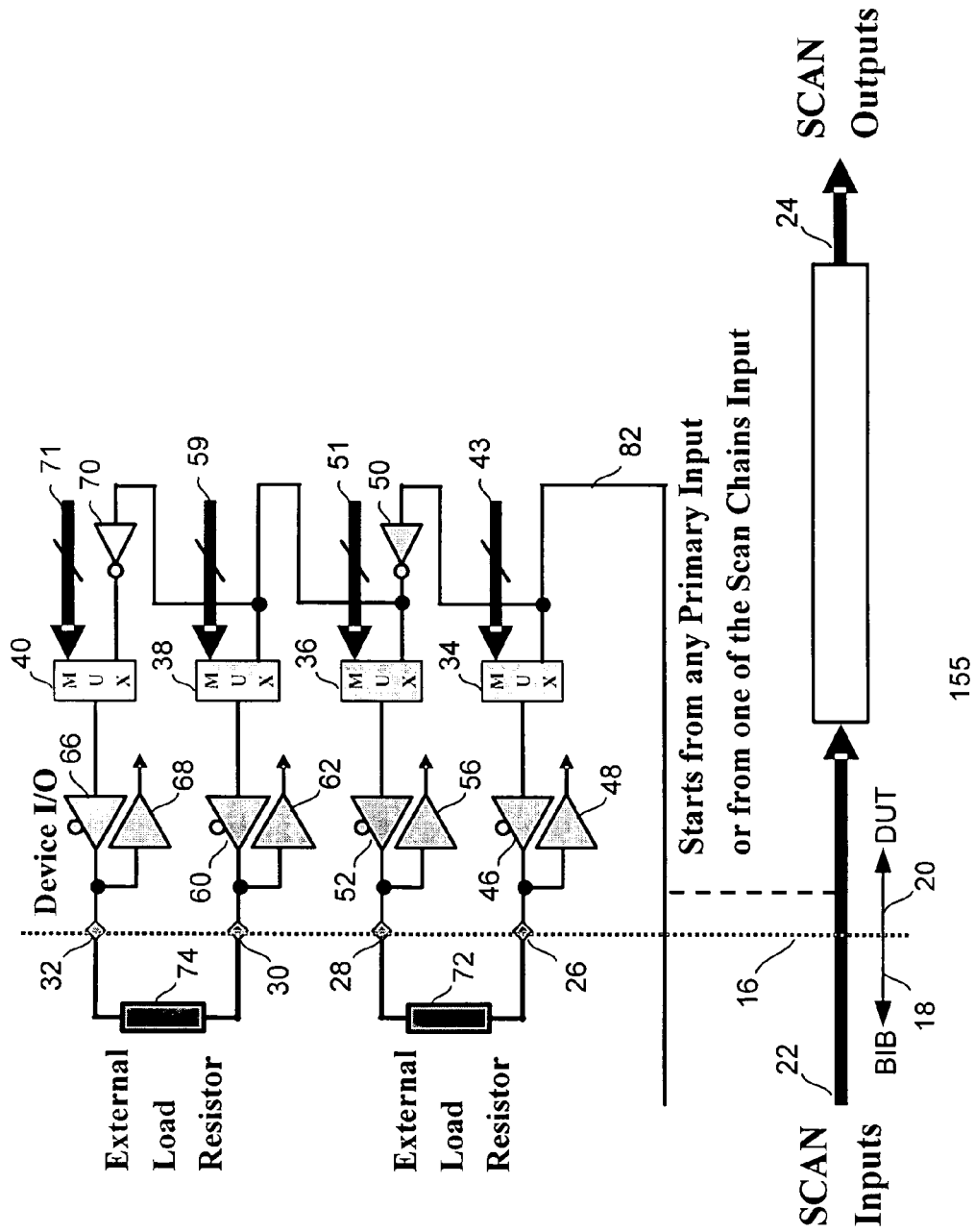
FIG. 4 is a diagram of a device DFT and burn-in-board according to a third embodiment.

FIG. 4 illustrates a diagram of the third embodiment of the present invention. The third embodiment is a modification of the system of the preferred embodiment that removes the inverter 42 of the first embodiment from the circuitry for I/O 26, which is a non-inverted output. This provides a NI output at I/O 26 and IV output at I/O 28. Similarly, inverter 58 of the first embodiment is removed from the circuitry of I/O 30 and NI output at I/O 32 (an even number of inverters in series, at end, are non-inverting the start signal).

The configurations of the second and third embodiments are alternative design choices for a IC designer that accomplish the same purpose of reducing the number of external components on a BIB by coupling an inverted and a non-inverted output on a DUT to a single resister 72, 74 on a BIB 18.

One skilled in the art will appreciate that the present invention can be practiced by other than the described embodiments, which are presented for purposes of illustration and not limitation, and the present invention is limited only by the claims that follow.

What is claimed is:

1. A system for performing a burn-in test using a burn-in-board, comprising:
    a device-under-test, coupled to the burn-in-board, wherein the device outputs an inverted test signal at a first input/output (I/O) and outputs a non-inverted test signal at a second I/O;
    a resistor, attached to the burn-in-board, that is coupled to the first I/O and coupled to the second I/O for placing a load resistance against the inverted test signal and the non-inverted test signal; and
    a MUX, coupled to the first I/O; for multiplexing signals from a functional output and a test signal from an inverter.

2. The system of claim 1, wherein the device-under-test has bi-directional I/Os scan inputs, and test-mode control inputs, and wherein the bi-directional I/Os are operable to be forced to an output mode.

3. The system of claim 1, wherein the device-under-test is an integrated circuit.

4. A method for performing a burn-in test using a burn-in-board, comprising:
    providing a device-under-test, coupled to the burn-in-board, wherein the device outputs an inverted test signal at a first input/output (I/O) and outputs a non-inverted test signal at a second I/O; and
    providing a resistor, attached to the burn-in-board, that is coupled to the first I/O and coupled to the second I/O for placing a resistance against the inverted test signal and the non-inverted test signal; and
    multiplexing signals from functional outputs and signals from an inverter chain with a MUX that is coupled to the first I/O.

5. The method of claim 4, further comprising:
    forcing bi-directional I/Os of the device to output mode.

6. The method of claim 4, wherein the device-under-test is an integrated circuit.

* * * * *